(12) United States Patent
Chuang et al.

(10) Patent No.: US 8,707,238 B2
(45) Date of Patent: Apr. 22, 2014

(54) METHOD TO DETERMINE OPTIMAL MICRO-BUMP-PROBE PAD PAIRING FOR EFFICIENT PGD TESTING IN INTERPOSER DESIGNS

(75) Inventors: Yi-Lin Chuang, Taipei (TW);
Cheng-Pin Chiu, Taoyuan (TW);
Ching-Fang Chen, Taichung (TW);
Ji-Jan Chen, Kaohsiung (TW); Sandeep Kumar Goel, San Jose, CA (US);
Yun-Han Lee, Baoshan Township (TW);
Charles C. C. Liu, Zhubei (TW)

(73) Assignee: Taiwan Semiconductor Manufacturing Co. Ltd., Hsin-Chu (TW)

( * ) Notice: Subject to any disclaimer, the term of this patent is extended or adjusted under 35 U.S.C. 154(b) by 0 days.

(21) Appl. No.: 13/484,531

(22) Filed: May 31, 2012

(65) Prior Publication Data

US 2013/0326463 A1 Dec. 5, 2013

(51) Int. Cl.
*G06F 17/50* (2006.01)

(52) U.S. Cl.
USPC ............. 716/126; 716/119; 716/105

(58) Field of Classification Search
USPC .......................... 716/105, 119, 126
See application file for complete search history.

(56) References Cited

U.S. PATENT DOCUMENTS 7,657,858 B2 * 2/2010 Chen et al. .................... 716/120
8,230,375 B2 * 7/2012 Madurawe .................... 716/117

* cited by examiner

*Primary Examiner* — Thuan Do
(74) *Attorney, Agent, or Firm* — Eschweiler & Associates, LLC

(57) ABSTRACT

The present disclosure relates to a method of routing probe pads to micro-bumps of an interposer. An interposer is provided having target micro-bumps and probe pads. The probe pads are initially unassigned. Target micro-bump locations and probe pad locations are obtained. Possible route assignments from the probe pads to the target micro-bumps are obtained. Costs are developed for the possible route assignments at least partially according to the target micro-bump locations and the probe pad locations. Final assignments are selected from the possible assignments according to the costs.

19 Claims, 12 Drawing Sheets

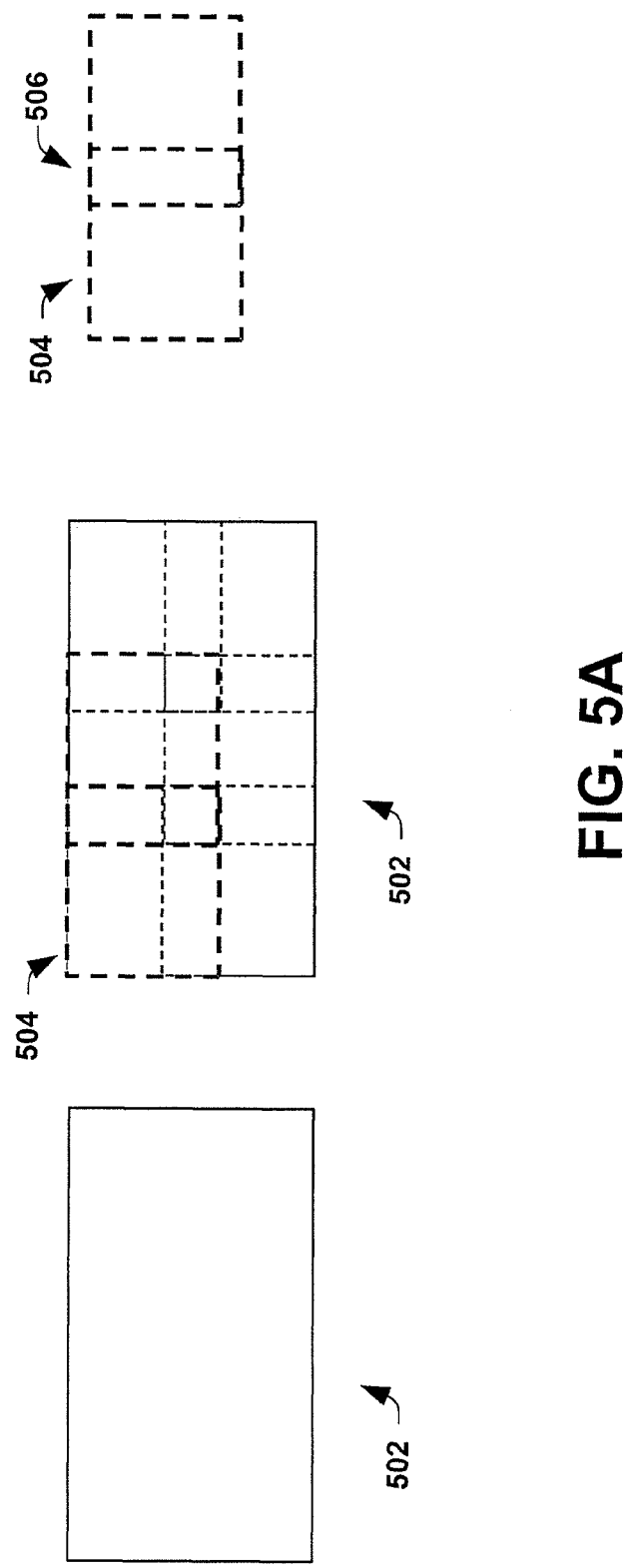

Input:
  $P$: set of probe-pads placed at islands
  $N$: set of target testing nets
Output:
  $M$: assignment map for probe-pads and micro-bumps 01. Compute $W(n_j)$ for all $n_j \in N$;
02. Sort $W(n_j)$ in descending order;
03. $L = \{\phi\}$;
04. for each $W(n_j)$ with two bumps $\{n_j^1, n_j^2\}$
05.    for each $p_i \in P$ and $p_i \notin L$,
06.       $d_{i,j}^1 = dist(p_i, n_j^1), d_{i,j}^2 = dist(p_i, n_j^2)$;
07.    Select $p_i$ with the smallest $d_{i,j}^1$;
08.    $m_j^1 = p_i, L = L + p_i$;
09.    Select $p_k$ with the smallest $d_{k,j}^2$ and $p_k \neq p_i$;
10.    $m_j^2 = p_k, L = L + p_k$;
11.    $M = M + \{m_j^1, m_j^2\}$;
12. return $M$.

FIG. 7C

METHOD TO DETERMINE OPTIMAL MICRO-BUMP-PROBE PAD PAIRING FOR EFFICIENT PGD TESTING IN INTERPOSER DESIGNS

BACKGROUND

Semiconductor device fabrication is a process used to create integrated circuits that are present in everyday electrical and electronic devices. The fabrication process is a multiple-step sequence of photolithographic and chemical processing steps during which electronic circuits are gradually created on a wafer composed of a semiconducting material.

The electronic circuits include various components, such as transistors, capacitors, resistors, and the like. The components need to be electrically connected to each other and/or other components, such as bond pads. Various techniques are utilized for electrically connecting the components, such as conductive vias, lines, channels, interconnects, and the like.

One mechanism to facilitate electrical connection between components is to utilize an interposer. This is a layer that does not contain any active transistors, only interconnects. The interposer is generally used for providing connections to multiple die or chips.

BRIEF DESCRIPTION OF THE DRAWINGS

FIG. 5A is a diagram illustrating partitioning of an interposer into a plurality of regions in accordance with this disclosure.

FIG. 7C is example pseudo code for implementing a method of selecting probe pad micro-bump pairs in accordance with this disclosure.

DETAILED DESCRIPTION

Figure 1:
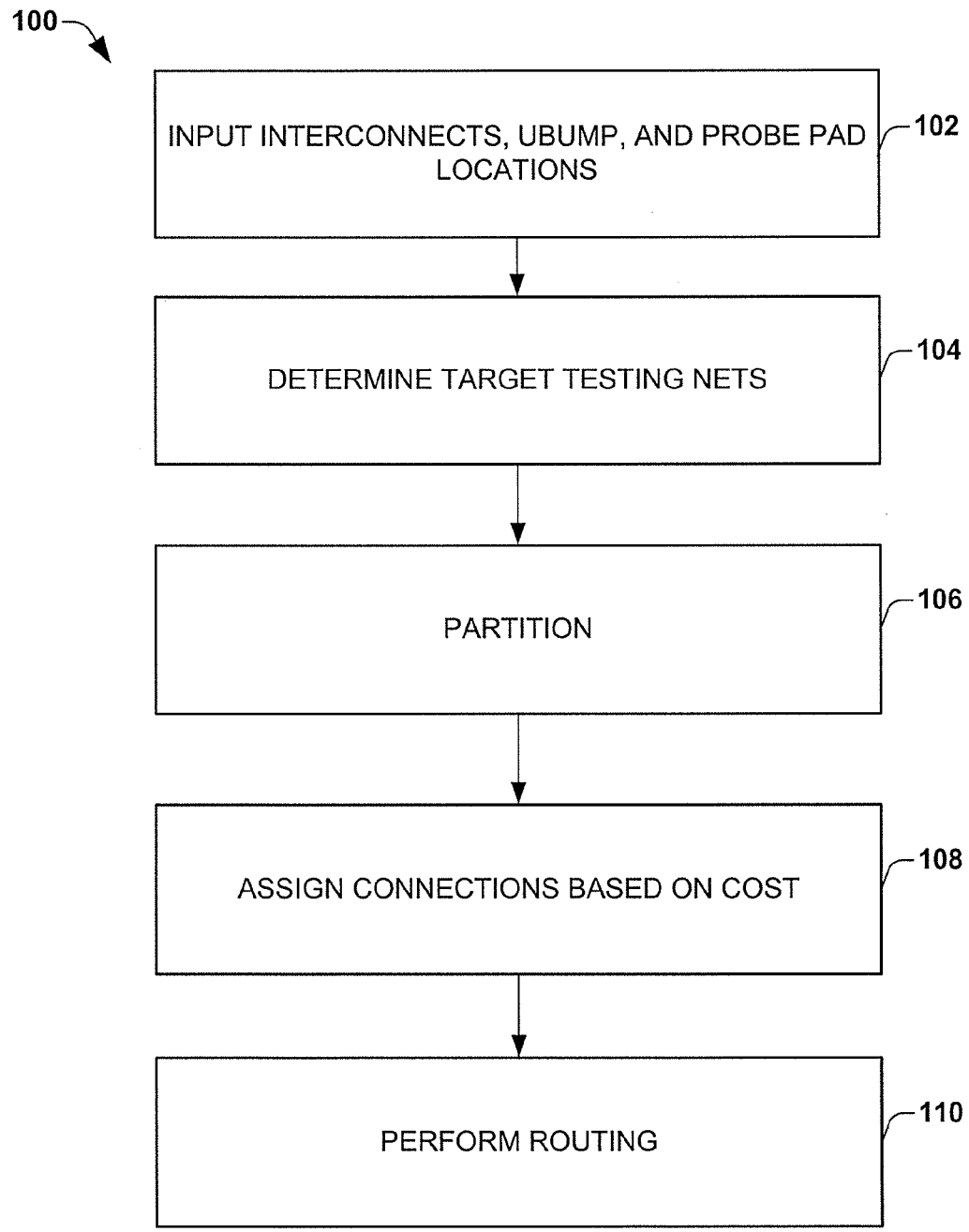
FIG. 1 is a flow diagram illustrating a method for performing routing of an interposer layer in accordance with this disclosure.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Interposers are a mechanism to facilitate electrical connection between components. It is a layer comprised almost only of passive components or connections and without active components, such as transistors. Interposers are generally used for providing connections to multiple die or chips and typically have a first side with micro-bumps and a second side with pads or probe-pads. The interposers include connections, also referred to as interconnects, between the micro-bumps. Interposers typically include three types of connections. A first type is a feed through, a second type is inter die connections, and a third type is a fan out connection. The probe pads provide electrical connections to the micro-bumps.

For testing purposes, at least a portion of the micro-bumps have probe pads associated therewith. This permits signals to be asserted to micro-bumps at probe pads and allows analyzing resulting signals at other micro-bumps by using other probe pads. Thus, characteristics of the micro-bumps and interconnects can be analyzed or tested.

The connection between micro-bumps and/or probe pads is referred to as pairing. The paired connections have associated characteristics or costs associated therewith. For example, the paired connections have loading and capacitance due to the connections there between. Furthermore, it can happen that at least portions of some paired connects are unused.

A net is one or more connections or pairings between micro-bumps, such as for the three types of connections discussed above. A pairing or routing is a connection from a probe pad to an associated micro-bump. In one example, a fanout type net includes three micro-bumps connected to each other and three probe pads, one for each micro-bump.

There is only a limited number of probe pads available. Generally, it is not practical to assign a probe pad to every micro-bump in an interposer. Further, the routing or pairing of the probe pads to the micro-bumps is important. Unnecessary lengths, for example, can degrade the testing of the micro-bumps and interconnects by introducing resistance and/or capacitance into the measurements. Thus, routing of probe pads to micro-bumps have associated costs and these costs, if high, can negatively impact testing.

It is appreciated that a variety of pairings are possible to connect particular or selected micro-bumps and probe pads. Multiple, varied pairings may result in needed or selected connectivity. However, they can have very different costs.

Typically, selecting pairings for probe pads to micro-bumps is a manual process. A pairing is selected and evaluated. A person then decides whether the pairings work well enough. If not, manual adjustments are made. However, this approach is very time consuming and doesn't necessarily provide an improved or optimal pairing or routing of the nets. Further, the manual approach is realistically limited to small designs only. Larger designs are too complex to be adjusted manually. Finally, the manual approach does not lead to product quality solutions.

This disclosure includes methods to find improved or optimal pairing between micro-bumps and probe pads. The improved or optimal pairing is referred to as enhanced routing. The enhanced routing facilitates testing of interposers by methodologies, such as pretty good die (PGD) testing. PGD testing is a methodology for passive interposer testing. For PGD testing, every net is typically connected to two probe pads via micro-bump to probe pad connections. This permits front-side probing of the interposer.

FIG. 1 is a flow diagram illustrating a method 100 for performing routing of an interposer layer in accordance with this disclosure. The method 100 provides enhanced routing of probe pads to micro-bumps. The method 100 facilitates testing of the interposer by mitigating routing costs from the probe pads to the micro-bumps.

The method 100 begins at block 102, wherein interconnects, micro-bump locations and probe pad locations for an interposer are obtained. The interposer is a layer comprised substantially of passive components, without active components, such as transistors. The interposer is used for providing connections to multiple die or chips. The interposer has a first side with micro-bumps, referred to as micro-bumps, and a second side with pads or probe-pads. The micro-bumps are typically coupled to contacts on the multiple dies and provide connectivity to and between the multiple dies. The probe pads permit external connections or probe connections to the interposer and facilitate testing of the interposer and/or the dies connected to the micro-bumps.

There are three types of interconnects for the micro-bumps. A first type is a feed through, a second type is inter die connections, and a third type is a fan out connection. A feed through interconnect is a single connection through an interposer layer to/from a single micro-bumps. An inter die interconnect is a connection of a number of micro-bumps from multiple dies. For example, an inter die interconnect includes a first micro-bump associated with a first die and a second micro-bump associated with a second die. The first micro-bump and the second micro-bump have an interconnect there between. A fanout type is an interconnect that connects a plurality of micro-bumps together. For example, three micro-bumps can be connected to each other by a single interconnect.

A number of probe pads are available on the interposer. Typically, the number of probe pads is substantially less than the number of micro-bumps. The probe pads have locations on the interposer.

Target testing nets are determined at block 104. A net is defined as a connection or interconnect to one or more micro-bumps. A relatively large number of nets are present on the interposer. However, there are only a limited number of the probe pads available. Thus, only a subset of the available nets can be tested. The subset is referred to as the target nets. The total number of micro-bumps present in the target nets should be less than or equal to the number of available probe pads.

The target nets or target interconnects are identified by impact or impact factors. The impact factors include, for example, yield impact, likelihood of failure, and the like. For example, longer interconnects are more likely prone to manufacturing failure and are typically targeted for testing.

The interposer is partitioned at block 106 into multiple regions. If the interposer size is large enough, such as having over 1,000 micro-bumps, the interposer can be partitioned into multiple regions. If the interposer size is not large, the interposer can be maintained as a single region.

Partitioning the interposer can reduce computations and increase efficiency of identifying routings between probe pads and the targeted micro-bumps.

Routings or pairings for the probe pads and the target micro-bumps are assigned at block 108. The assignments include connections between the probe pads and associated micro-bumps. The assignments are determined by determining costs between the probe pads and the micro-bumps and assigning the probe pad to micro-bump connections with lower or lowest cost.

The assigned routings for the probe pads and micro-bumps are performed at block 110. Thus, the probe pads are connected to the micro-bumps. The routings generally have a lower cost than routings from other mechanisms or methodologies. Furthermore, the interposer can be tested using PGD or another testing mechanism.

It is appreciated that the method 100 can be performed multiple times to improve the routings and lower the cost for the assigned routings.

Figure 2:
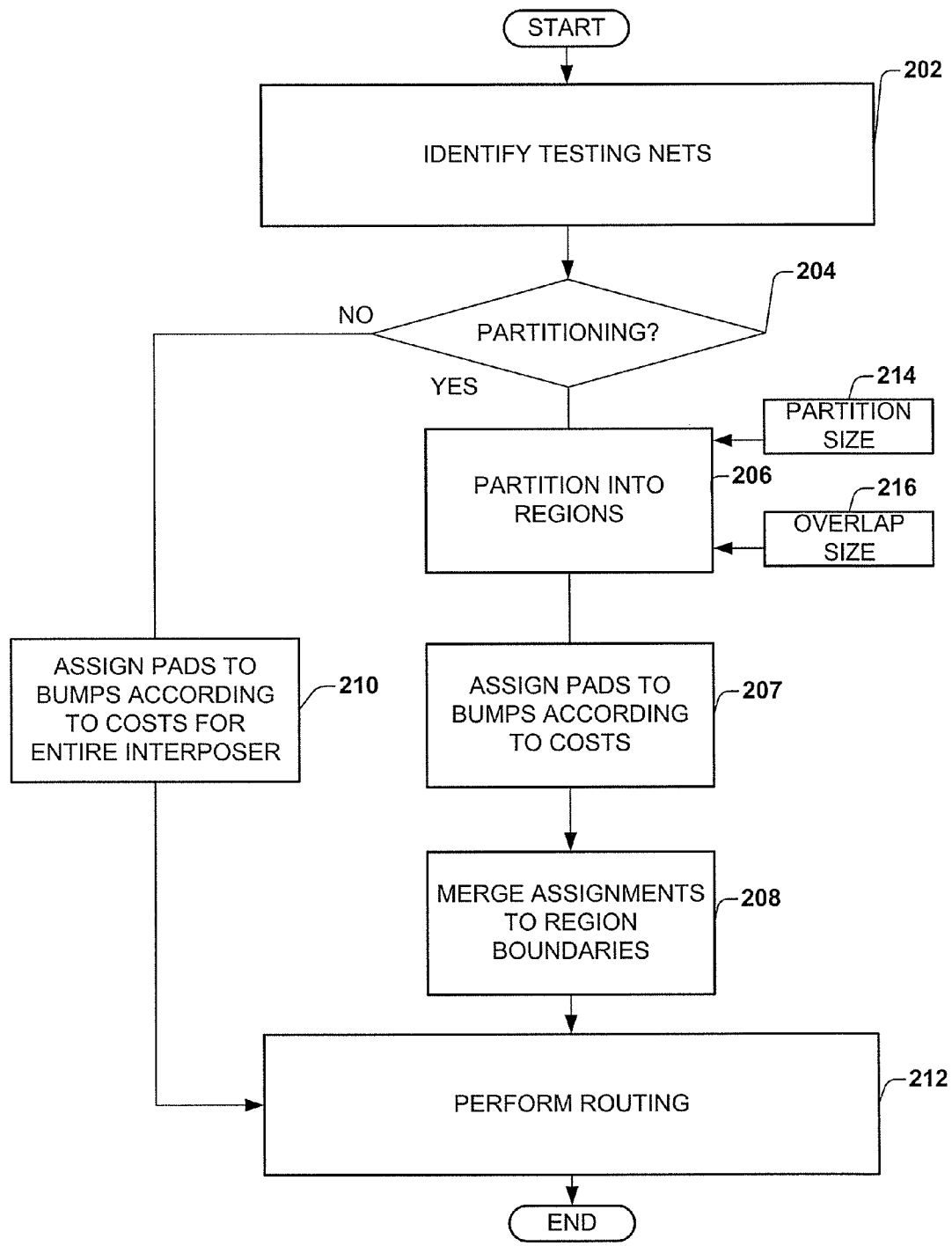
FIG. 2 is a flow diagram illustrating a method for performing routing of an interposer layer in accordance with this disclosure.

FIG. 2 is a flow diagram illustrating a method 200 for performing routing of an interposer layer in accordance with this disclosure. The method 200 is applicable to interposers of varied sizes. Further, the method 200 facilitates device testing by providing routing top probe pads that enhances semiconductor die testing mechanisms, such as pretty PGD testing.

The method 200 begins at block 202, where target testing nets of an interposer are identified. The interposer is a layer comprised substantially of passive components, without active components, such as transistors. The interposer is used for providing connections to multiple die or chips. The interposer has a first side with micro-bumps, referred to as micro-bumps, and a second side with pads or probe-pads. The micro-bumps are generally coupled to contacts on the multiple dies and provide connectivity to and between the multiple dies. The probe pads permit external connections or probe connections to the interposer and facilitate testing of the interposer and/or the dies connected to the micro-bumps.

The interposer includes connections between the micro-bumps. The Interposer includes three types of connections. A first type is a feed through, a second type is inter die connection, and a third type is a fan out connection. These types of connections are described in greater detail above.

A net includes one or more micro-bumps and the interconnects there between. The interposer includes a relatively large number of nets. Some of the nets are more critical to device performance than others. The nets that are more critical are selected or identified as target testing nets, also referred to as target nets. Furthermore, there are only a limited number of probe pads available for testing purposes. Therefore, only the higher priority nets are selected or targeted for testing.

The target nets can be identified by a suitable methodology or mechanism. In one example, nets with a high probability of defects are identified as the target nets. In another example, nets having a size greater than a threshold value are identified as the target nets. The size refers to the number of micro-bumps present in the net. It is appreciated that other suitable methodologies are contemplated.

In one example, the target nets are selected according to available probe pads and impact factors. The impact factors include, for example, yield impact, likelihood of failure, and the like.

A determination is made on whether partitioning is needed at block 204. Generally, partitioning is needed when a size of the interposer exceeds a threshold value. The size of the interposer can be defined in terms of geographic area, number of nets, and/or number of micro-bumps present in the interposer. In one example, the interposer size is the number of micro-bumps and/or interconnects present for the interposer.

If the method 200 determines that partitioning is needed, the method 200 proceeds to block 206. The interposer is partitioned into overlapping regions at block 206 according to a partition or region size and an overlap size.

The partition size is selected at block 214 and is a size that includes a suitable number of nets, but is small enough for relatively fast analysis. The number of nets can be predetermined, such as 5. However, it is appreciated that the number of nets permitted per partition or region can vary according to implementation.

In one example, designers specify and/or provide parameters to control regions width and height. In another example, the width and height is computed according to the interposer size and the number of probe pads.

The overlap size is selected at block 216. The overlap size is selected to facilitate efficient and low cost use of probe pads. The region includes the overlap size or overlap regions. In one example, designers specify or provide parameters to set overlap region size. In another example, the overlay size is determined according to corresponding region/partition height and width.

Routings are assigned to micro-bumps and probe pads for each region at block 207. The routings or pairings are assigned according to cost functions for each possible connection for the micro-bumps within the region. It is noted that overlap portions shared by different regions can have different pairings or routings.

A variety of mechanisms can be utilized to assign routings between the micro-bumps and the probe pads. Several examples will be discussed below. However, generally, proposed or possible connections between the micro-bumps and probe pads are developed. Cost functions are generated for the proposed connections. The cost functions include one or more of several factors including, but not limited to yield, routability, timing, power costs, and the like. In one example, the factors have varied weights that are selected according to application requirements. For example, power costs or consumption could have a larger weight then timing factors.

In one example, a lowest cost connection/routing for each pair is selected. In another example, a routing is selected for micro-bump to probe pad as long as the cost is below a threshold value.

The routing assignments for overlap regions are merged at block 208. The overlap regions are also referred to as boundaries or boundary regions. The same overlap region can have multiple routing assignments. These multiple routing assignments are analyzed to select or merge routing assignments for the overlap regions into final values or assignments.

In the event that partitioning is not performed, routings are assigned to micro-bumps and probe pads for the target nets of the interposer at block 207. The operation is similar to that of the region assignments; however there is only one region and no overlap regions. Similar to the regions, the routings or pairings are assigned according to cost functions for each possible connection for the target nets of the interposer.

The region routing assignments and the overlap region assignments are performed at block 212. In one example, these assignments are provided as final assignments for fabrication of the interposer. In another example, these assignments are implemented in the fabrication of the interposer.

The interposer, with the selected routing at block 212, typically has a substantially lower cost than the interposer prior to performance of the method 200. In one example, the interposer is then assembled with the selected connections.

Subsequently, testing can be performed on the interposer using the probe pads to test the target nets.

Figure 3:
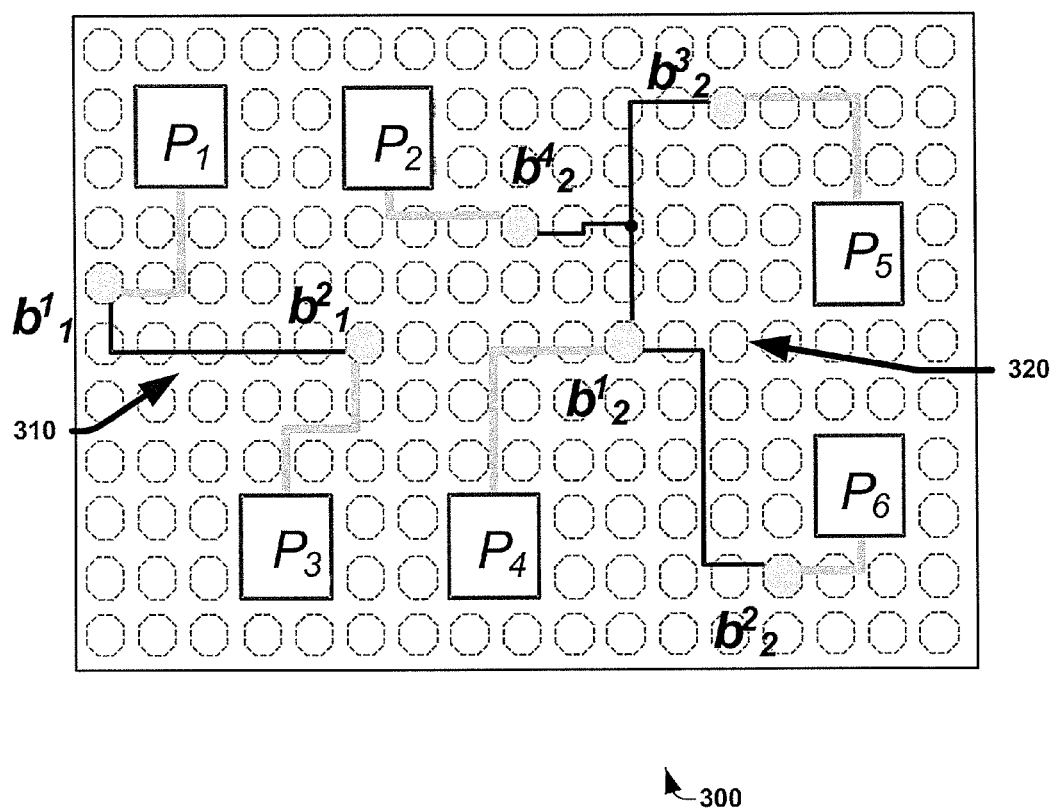
FIG. 3 is a diagram of an example interposer in accordance with this disclosure.

FIG. 3 is a diagram of an example interposer 300 in accordance with this disclosure. The interposer 300 is provided as an example to facilitate understanding of the disclosure. The interposer is shown with a first net 310 and a second net 320. This example illustrates how to determine probe pad and micro-bump sets to test each wire in the interposer 300.

The first net 310 includes micro-bumps $b^1_1$ and $b^2_1$. The second net 320 includes micro-bumps $b^1_2$, $b^2_2$, $b^3_2$ and $b^4_2$. The notation used is $b^{bump\_id}_{net\_id}$. The first net 310 is a two-pin net and the second net 320 is a multi-fanout net. The first net 310 could, for example, be an inter-die type connection.

For testing purposes, such as PGD testing, probe pads are assigned to each of the micro-bumps to facilitate testing of interconnects between the micro-bumps. A first pad-bump set is determined for the first net 310 and includes $\{\{P_1, b^1_1\}, \{P_3, b^2_1\}\}$. A second pad-bump set is determined for the second net 320 and includes $\{\{P_2, b^4_2\}, \{P_4, b^1_2\}, \{P_5, b^3_2\}, \{P_6, b^2_2\}\}$.

The routings from the probe pads to the micro-bumps are shown in FIG. 3. These routings are obtainable using the methods 100 or 200 above to mitigate the cost functions for each routing and to enable testing of the interconnects of each net.

Figure 4:
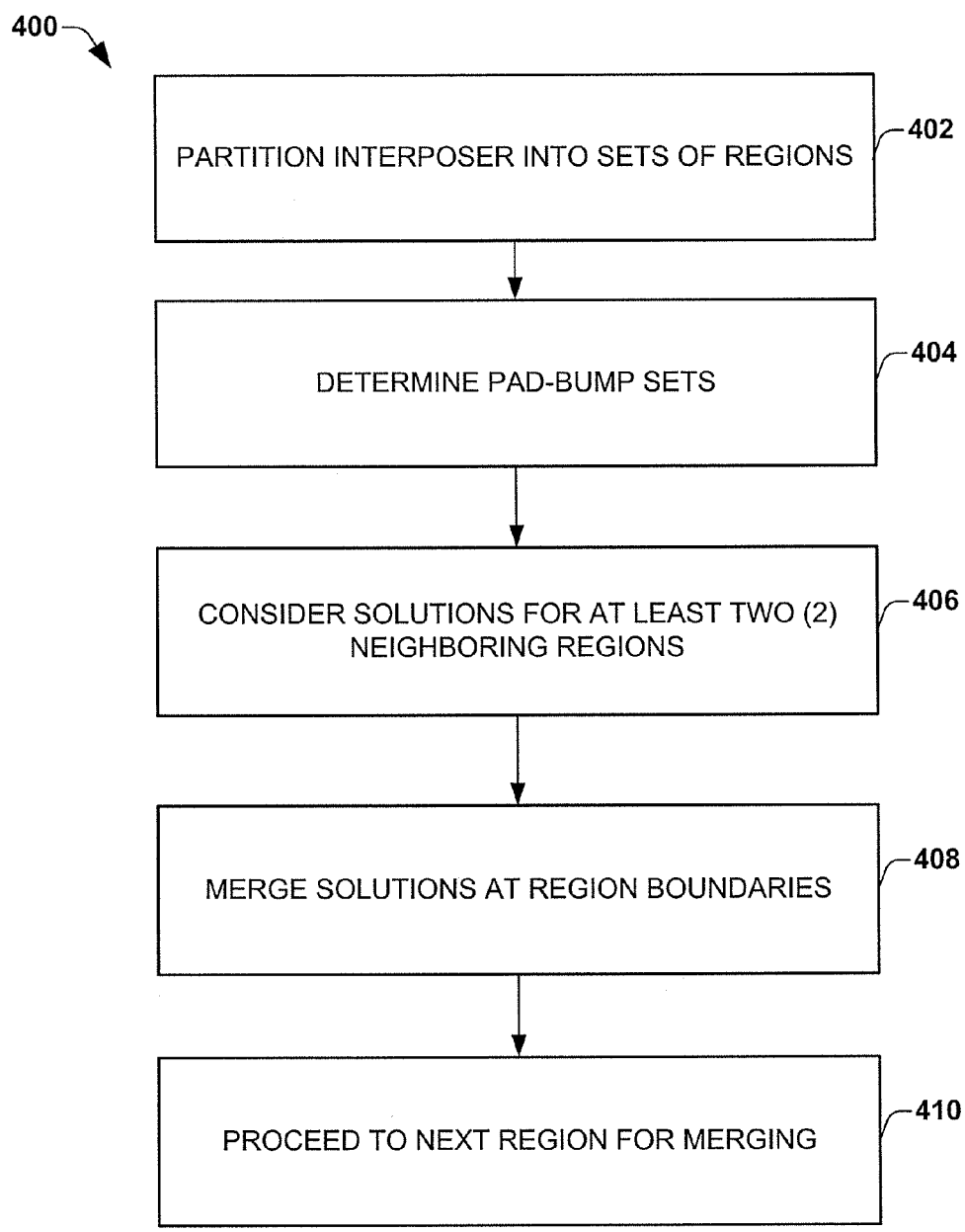
FIG. 4 is a flow diagram illustrating a method of partitioning an interposer in accordance with this disclosure.

FIG. 4 is a flow diagram illustrating a method 400 of partitioning an interposer in accordance with this disclosure. The method 400 can be incorporated into other methods of the disclosure, such as methods 100 and 200.

The interposer is partitioned into sets of regions at block 402. The regions include overlap regions that are shared by neighboring regions. In one example, the interposer is partitioned according to a partition size and an overlap size. The partition size sets the size for the regions. The overlap size is selected to encompass probe pads and/or micro-bumps of the neighboring regions.

Probe pad and micro-bump pairs or sets are determined for a current region of the plurality of regions at block 404. FIG. 3, described above, provides an example of determining probe pad and micro-bump pairs or assignments for a region.

Possible assignments or routings are considered at one or more overlap regions for the current region at block 406. The assignments or routings are also referred to as solutions. The overlap regions are regions shared by neighboring regions. The overlap regions may have varied assignments by neighboring regions. For example, a probe pad for one region can be assigned or routed to a different micro-bump in a second region.

The assignments or routings are merged to final assignments at block 408. The final assignments are also referred to as final solutions. The final assignments are merged or determined according to cost factors, such as those described above.

Once complete, the method 400 proceeds to a next region at block 410 for similar evaluation. The blocks are repeated for the next and remaining regions of the interposer until final assignments are obtained for all the regions.

Figure 5B:
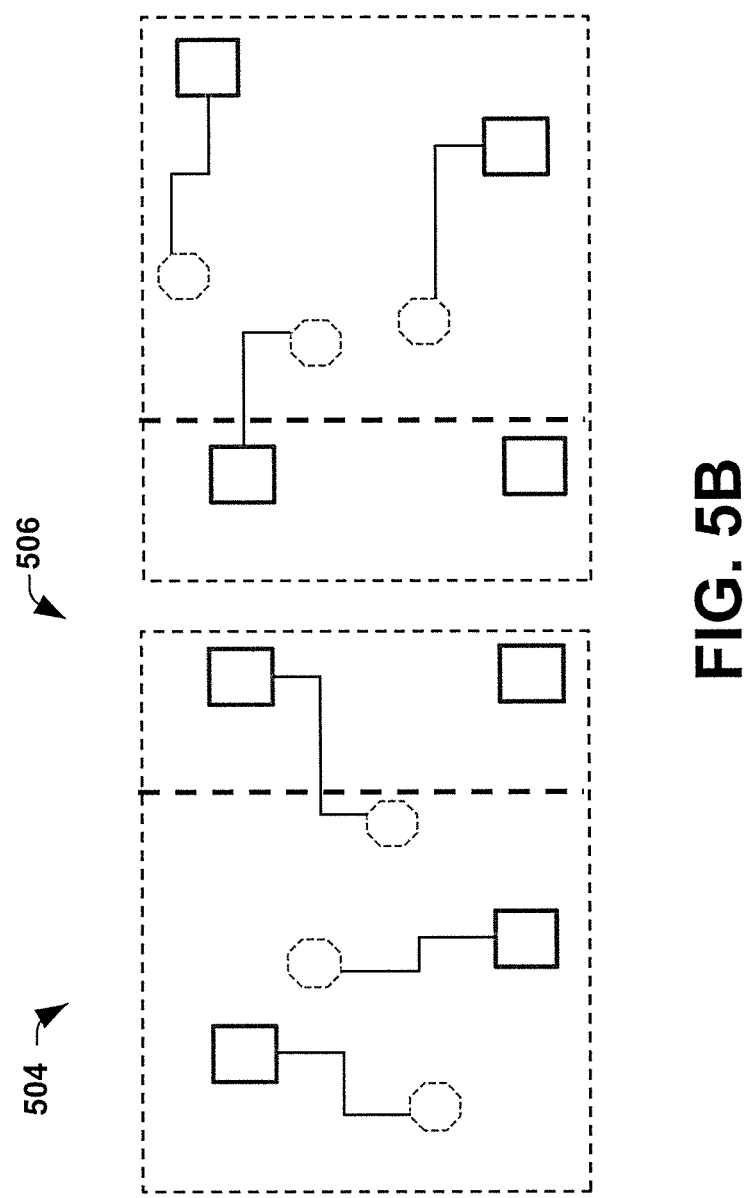
FIG. 5B is a diagram illustrating merging overlap regions of an interposer in accordance with this disclosure.
Figure 5C:
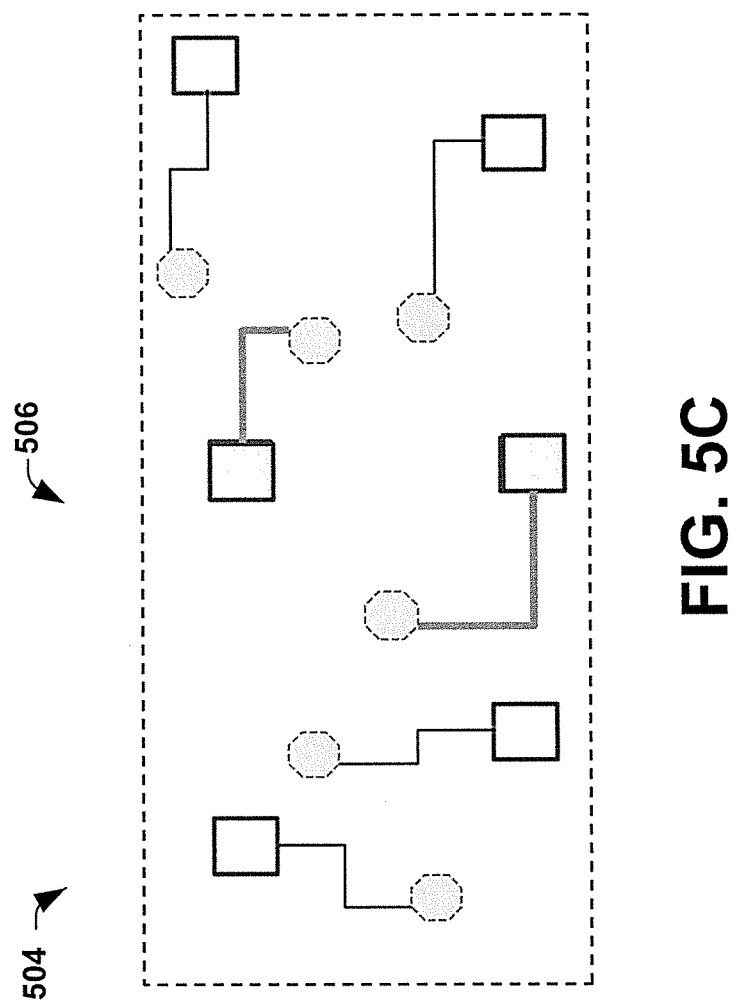
FIG. 5C is a diagram illustrating a merged region of an interposer in accordance with this disclosure.

FIGS. 5A, 5B and 5C are provided as a non-limiting example for the method 400. It is appreciated that the method 400 operates on a variety of interposers having varied configurations.

FIG. 5A is a diagram illustrating partitioning of an interposer 502 into a plurality of regions in accordance with this disclosure. On a left side, the interposer 502 is shown without partitioning. In the middle, the interposer 502 is shown partitioned into the plurality of regions. A current region 504 is shown by the dashed lines. It is noted that an adjacent region shares an overlap region 506 of the current region, as shown in the right side and bottom side. Probe pad and micro-bump pairs or sets are determined for the current region 504.

FIG. 5B is a diagram illustrating merging overlap regions of an interposer 502 in accordance with this disclosure. The overlap region 506 of the current region 504 is compared with an overlap region of an adjacent region. It can be seen that the probe pads for the current overlap region and the adjacent overlap region are varied. An upper probe pad is assigned to a micro-bump in the current region 504 and a micro-bump in the adjacent region. Further, a lower probe pad is unused.

FIG. 5C is a diagram illustrating a merged region of an interposer 502 in accordance with this disclosure. Analysis is performed on the overlap regions to determine routing assignments. In this example, the upper probe pad is assigned to the micro-bump in the adjacent region and the lower probe pad is assigned to the micro-bump in the current region 504.

There are several suitable mechanisms to determine routing assignments between probe pads and target micro-bumps. A first example, a graphical approach, in accordance with this disclosure is demonstrated in FIGS. 6A to 6D. The graphical approach determines probe pad micro-bump pairs by using a minimum cost, max flow algorithm for efficiency. The number of edges is reduced by setting a search window. A directed edge is created from each probe pad to micro-bump with an associated cost function $f(i,j)$.

Micro-bumps of a net are regarded as separate nodes. For each pad node, a directed edge to each bump node is created. The edge capacity $u\_\{i,j\}$ is set to 1 and the cost $c\_\{i,j\}$ is $f(i,j,k)$. An edge from source to each pad node is connected with $c\_\{s,i\}=0$ and $u\_\{s,i\}=N$ (N>1); the same setting is applied for the edge from each bump node to destination. However, in an interposer design, the total number of such edges could be large, directly solving this flow graph is time consuming.

Figure 6B:
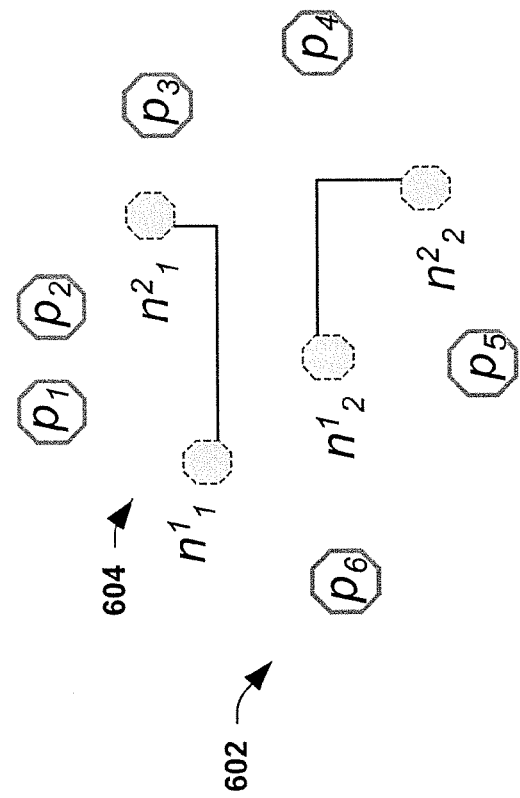
FIGS. 6A to 6D illustrate a graphical approach to identifying low cost routings or pairings between micro-bumps and probe pads in accordance with this disclosure.

To efficiently reduce the runtime, edge reduction is performed to remove potentially redundant edges. For each bump, we define a search window for the network-flow formulation. The pads outside the search window are ignored; therefore, the flow graph size is greatly reduced. As shown in FIG. 6D, when constructing edges from pad nodes to a bump node, those edges with larger costs due to outside the window are pruned. Therefore, the total edge number is reduced, which makes the network-flow solving more efficient.

Figure 6A:
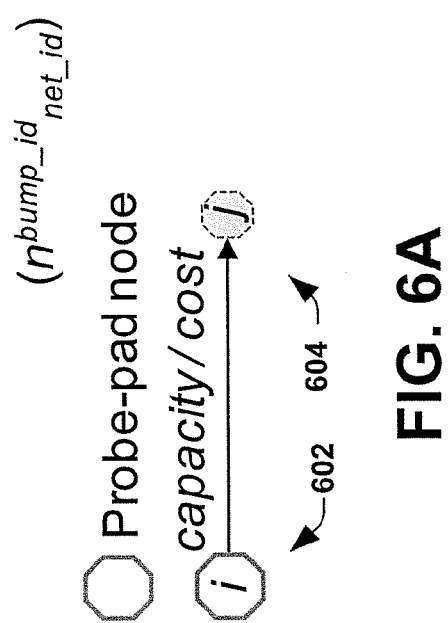
Figure 6D:
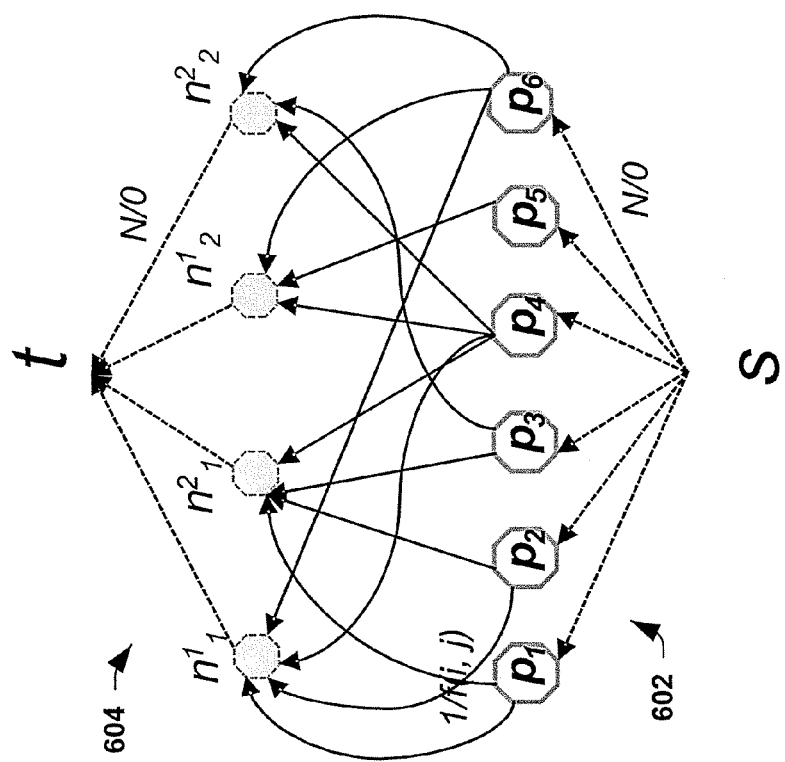

FIG. 6A illustrates the notation used to identify probe pads 602 and micro-bumps 604. An example probe pad i is shown with a cost to an example micro-bump j.

FIG. 6B illustrates an example set of micro-bumps 604 and probe pads 602. Note that the probe pads 602 are not assigned to the micro-bumps at this point.

Figure 6C:
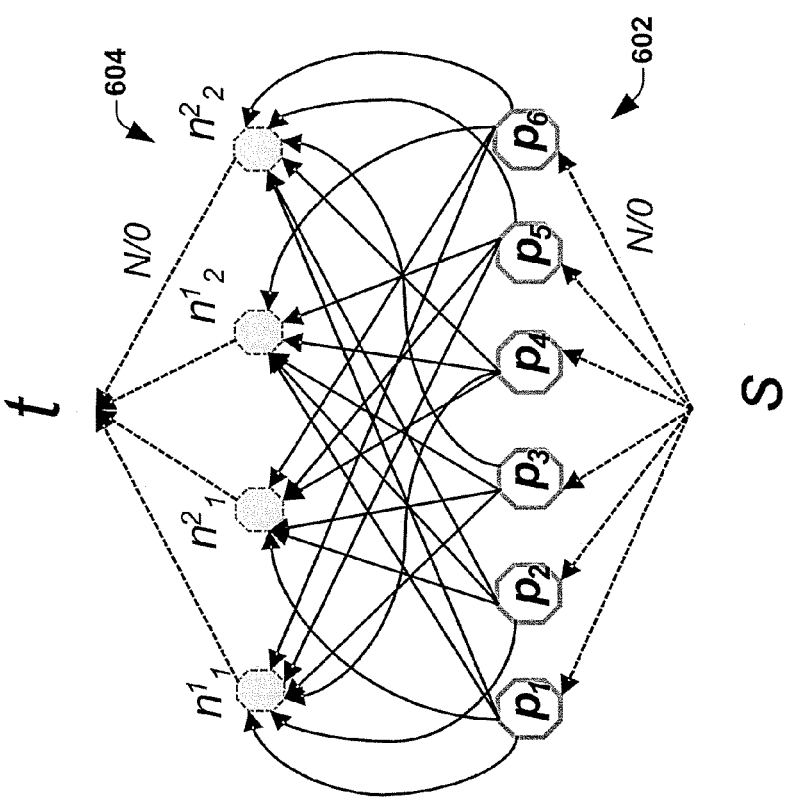

FIG. 6C is a graph illustrating all possible probe pad to micro-bump connections. Each edge has an associated cost $f(i,j)$. Thus, there are 6 possible connections to each micro-bump for a total of 24 micro-bumps.

FIG. 6D is a graph illustrating a reduced number of edges for the probe pad to micro-bump connections. A search window having a length and width is established. The search window is positioned about each probe pad. Only connections to micro-bumps within the search window are added as edges to the graph.

For example, a search window for pad P1 only encompasses micro-bumps $n^1_1$ and $n^2_1$. Thus, the graph only has edges from P1 to micro-bumps $n^1_1$ and $n^2_1$. The search window moves to each probe pad in order to form the reduced graph shown in FIG. 6D.

The reduced number of edges in the graph facilitates obtaining suitable assignments faster and with less computational complexity. Each edge is analyzed for the cost and the lowest cost pair for each micro-bump is selected or assigned.

Figure 7A:
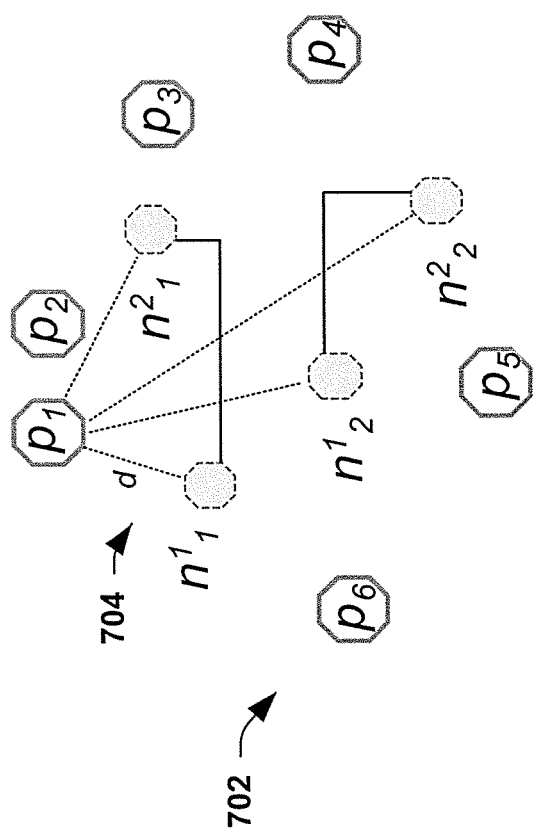
FIG. 7A is a diagram illustrating another mechanism to select probe pad and micro-bump pairs in accordance with this disclosure.

FIG. 7A is a diagram illustrating another mechanism to select probe pad and micro-bump pairs in accordance with this disclosure. For this mechanism, a cost is determined for a current probe pad to available micro-bumps. The smallest cost path is selected and assigned. Then the next probe pad is selected and costs are determined for the new current probe pad to the remaining micro-bumps. The mechanism continues until probe pads are assigned to all micro-bumps.

FIG. 7A shows a number of probe pads 702 and a number of micro-bumps 704. In this example, the cost is selected as the distance d. Thus, for example, $P_1$ is assigned to $n^1_1$ during the first iteration. P 1 is assigned to $n^2_1$ during a second iteration.

Figure 7B:
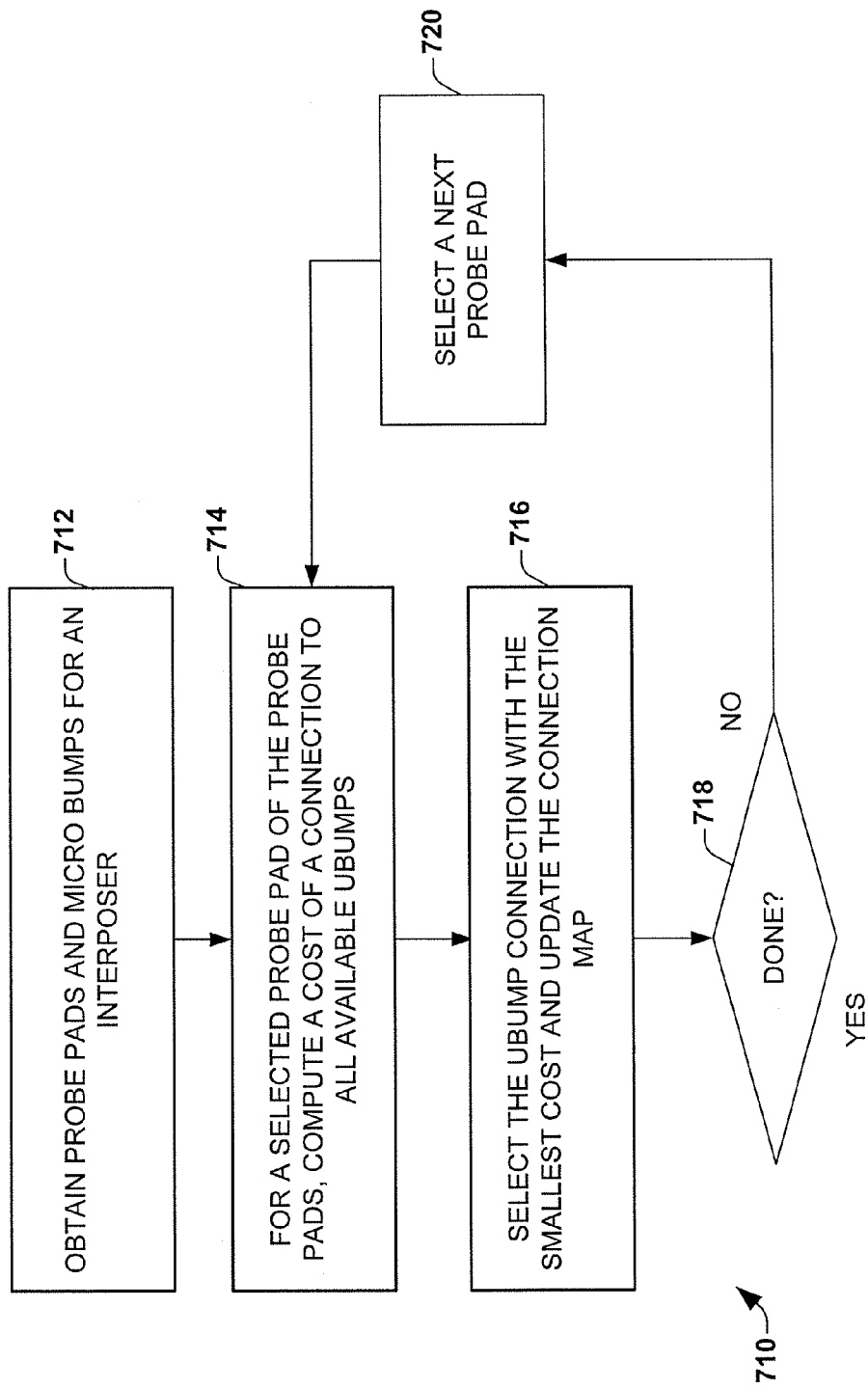
FIG. 7B is a flow diagram illustrating a method of selecting probe pad micro-bump pairs in accordance with this disclosure.

FIG. 7B is a flow diagram illustrating a method 710 of selecting probe pad micro-bump pairs in accordance with this disclosure. The method 710 elaborates on the example provided in FIG. 7A. The method 710 determines a cost for available micro bump to probe pad pairs and assigns the lowest cost pair.

The method 710 begins at block 712 where probe pads and micro bumps are obtained for an interposer. In one example, the micro bumps are target micro bumps associated with target nets. The probe pads and the micro bumps have locations or positions on an interposer.

A probe pad is selected and connection costs are determined for available micro bumps at block 714. It is appreciated that one or more of the micro bumps can be previously assigned to a probe pad and, therefore, not one of the available micro bumps. The connection costs include one or more characteristics. In one example, the connection cost is associated with distance from the selected probe pad to the available micro bumps.

The micro bump connection with the lowest cost is selected for the selected or current probe pad. The associated micro bump is removed from the list of available micro bumps. If additional probe pads remain unassigned, a next probe pad is selected at block 720 and the method continues to block 714.

Otherwise, if all probe pads have been assigned micro bumps, the method 710 stops. At this point, the selected connections can be routed from the micro bumps to the probe pads.

FIG. 7C is example pseudo code for implementing the above method 710 in accordance with this disclosure. The pseudo code utilizes a set of probe pads and a set of target testing nets. The target testing nets include target micro bumps.

It is appreciated that a longer wire tends to have a higher probability of manufacturing failure, such as from shorts, metal distortions, and the like. The order of connections is determined by a net wire length as shown in lines 1-2. For each micro bump of a net, the distance between it and available probe pads is computed between it and available probe pads. Based on the distance, the probe pad micro bump pair is chosen. Lines 7-10 show the assignment for a net in turn searches the priority queue of two micro bumps and marks the probe pad as unavailable if the decision is made.

A third mechanism that can be used to assign pairs utilizes a formula. Integer Linear Programming (ILP) is utilized to formulate the assignments. A variable has an integer value from 0 to 1 to indicate whether the probe pad micro-bump pair exists or not.

$$\min \sum f(i,j,k) x^k_{i,j}$$

$$\text{s.t.} \quad \sum_k x^k_{i,j,k} \leq 1$$

$$\sum_i x^k_{i,j} = 1, \quad \forall k \in K \text{ for each net,}$$

where: $x^k_{i,j}$: a candidate pad i is chosen to connect with micro-bump k of net j $f(i,j,k)$: cost function for pad and bump The cost function is utilized to obtain the routing assignments for the probe pad micro-bump pairs.

The below table provides a comparison between a manual approach and methods in accordance with this disclosure. It can be seen that the methods of this disclosure result in considerable reduction in time spent as compared with the manual approach. Additionally, the benefit increases as the number of micro bumps and probe pads increases. Further, the lengths of the probe pad to micro-bump routing is also reduced substantially.

|  | Manual Approach | | Method of this disclosure | | |
| --- | --- | --- | --- | --- | --- |
| #bumps/ #pads | WL (um) | Spent time | WL (um) | WL Reduction | Spent time |
| 40/40 | 889.380 | 5 min | 686.980 | 23% | 0.11 sec |
| 80/80 | 1469.355 | 10 min | 1117.585 | 24% | 0.12 sec |
| 200/200 | 3161.450 | 1 hour | 2155.715 | 32% | 0.77 sec |
| 400/400 | 8089.58 | 2 hour | 6144.01 | 24% | 0.75 sec |
| 500/500 | 11176.370 | <0.5 day | 9133.285 | 18% | 1.17 sec |
| 1000/1000 | NA | Almost impossible | 14772.895 | NA | 0.5 sec |

It will be appreciated that while reference is made throughout this document to exemplary structures in discussing aspects of methodologies described herein, that those methodologies are not to be limited by the corresponding structures presented. Rather, the methodologies (and structures) are to be considered independent of one another and able to stand alone and be practiced without regard to any of the particular aspects depicted in the Figs.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

The present disclosure includes a method of routing probe pads to micro-bumps of an interposer. An interposer is provided having target micro-bumps and probe pads. The probe pads are initially unassigned. Target micro-bump locations and probe pad locations are obtained. Possible route assignments from the probe pads to the target micro-bumps are obtained. Costs are developed for the possible route assignments at least partially according to the target micro-bump locations and the probe pad locations. Final assignments are selected from the possible assignments according to the costs.

The present disclosure includes another method of routing an interposer. The interposer is provided having target micro-bumps and probe pads. The probe pads are initially unassigned. The interposer is divided into regions according to a partition size and an overlap size. Region assignments are developed from probe pads and target micro-bumps within each region. Assignments for overlap regions are merged to develop final assignments. The probe pads are routed to the target micro-bumps according to the final assignments.

The present disclosure includes a method of routing an interposer. The interposer includes target micro-bumps and probe pads within a region. The region is one of a plurality of regions. Target micro-bump locations and probe pad locations are obtained for the region. A reduced set of route assignments are identified according to a search window. Costs are developed for the reduced set of route assignments. Region assignments are selected from the reduced set of route assignments.

While a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A method of routing an interposer operating on a computer mechanism, the method comprising:
    providing the interposer having target interconnects, micro-bumps and probe pads;
    obtaining target micro-bump locations for the target micro-bumps and probe pad locations for the probe pads;
    identifying possible route assignments from the probe pads to the target micro-bumps;
    developing costs for the possible route assignments;
    selecting final assignments from the possible route assignments according to the costs; and
    routing connections from the probe pads to the micro-bumps according to the final assignments.

2. The method of claim 1, further comprising performing pretty good die testing using the probe pads.

3. The method of claim 1, further comprising selecting the target micro-bumps from a plurality of micro-bumps present on the interposer.

4. The method of claim 3, wherein the number of the target bumps is less than the number of the plurality of micro-bumps.

5. The method of claim 3, wherein selecting the target micro-bumps is performed according to impact factors.

6. The method of claim 5, wherein the impact factors include likelihood of failure.

7. The method of claim 1, the target micro-bumps are associated with target nets.

8. The method of claim 1, wherein the target micro-bumps are associated with target interconnects.

9. The method of claim 1, wherein developing costs comprises using a linear algorithm.

10. The method of claim 1, wherein developing costs comprises using an edge directed graph.

11. The method of claim 1, wherein identifying possible route assignments comprises identifying all possible route assignments from the probe pads to the target micro-bumps.

12. The method of claim 1, further comprising partitioning the interposer into a plurality of regions according to a size of the interposer, each including an overlap region shared with another region.

13. The method of claim 12, further comprising merging the overlap regions of the plurality of regions.

14. A method of routing an interposer operating on a computer mechanism, the method comprising:
    providing the interposer having target micro-bumps and probe pads;
    partitioning the interposer into regions according to a partition size and an overlap size;

developing region assignments for probe pads and target micro-bumps within each region;

merging assignments for overlap regions of each region to develop final assignments; and routing connections from the probe pads to the micro-bumps according to the final assignments.

15. The method of claim 14, wherein developing region assignments comprises computing a cost connections between a current probe pad of the probe pads and available micro-bumps of the target micro-bumps and selecting a lowest cost connection.

16. The method of claim 14, further comprising selecting the partition size and the overlap size according to computational efficiency and merge quality.

17. The method of claim 14, wherein partitioning the interposer comprises partitioning the interposer into a single region on a size of the interposer being below a threshold value.

18. A method of routing an interposer operating on a computer mechanism, the method comprising:

providing the interposer having target micro-bumps and probe pads within a region;

obtaining target micro-bump locations for the target micro-bumps and probe pad locations for the probe pads;

identifying a reduced set of route assignments from the probe pads to the target micro-bumps according to a search window;

developing costs for the reduced set of route assignments;

selecting region assignments from the reduced set of route assignments; and routing connections from the probe pads to the micro-bumps according to the region assignments.

19. The method of claim 18, wherein the reduced set of route assignments is substantially less than all possible route assignments from the probe pads to the target micro-bumps.

* * * * *